(12) United States Patent
Saito et al.

(10) Patent No.: US 10,998,210 B2
(45) Date of Patent: May 4, 2021

(54) SUBSTRATE PROCESSING APPARATUS

(71) Applicant: KOKUSAI ELECTRIC CORPORATION, Tokyo (JP)

(72) Inventors: Kazuhito Saito, Toyama (JP); Tsukasa Yashima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/131,973

(22) Filed: Sep. 14, 2018

(65) Prior Publication Data

US 2019/0013223 A1 Jan. 10, 2019

Related U.S. Application Data

(63) Continuation of application No. PCT/JP2016/078436, filed on Sep. 27, 2016.

(30) Foreign Application Priority Data

Apr. 8, 2016 (JP) .............................. JP2016-077997

(51) Int. Cl.
*H01L 21/67* (2006.01)

(52) U.S. Cl.
CPC .... *H01L 21/67276* (2013.01); *H01L 21/6719* (2013.01); *H01L 21/67184* (2013.01); *H01L 21/67201* (2013.01)

(58) Field of Classification Search
CPC ......... H01L 21/67276; H01L 21/67184; H01L 21/6719; H01L 21/67201
See application file for complete search history.

(56) References Cited

U.S. PATENT DOCUMENTS 6,954,716 B2 * 10/2005 Tanaka .............. H01L 21/67276
702/184
9,766,617 B2 9/2017 Ogawa et al.
(Continued)

FOREIGN PATENT DOCUMENTS

JP 2000-195805 A 7/2000
JP 2002-043290 A 2/2002
(Continued)

OTHER PUBLICATIONS

Japanese Office Action dated Jul. 17, 2019 for the Japanese Patent Application No. 2018-510223.
(Continued)

*Primary Examiner* — Thomas C Lee
*Assistant Examiner* — Anzuman Sharmin
(74) *Attorney, Agent, or Firm* — Volpe Koenig

(57) ABSTRACT

A configuration that maintains productivity and can automatically execute and control recipes includes a process chamber that processes a substrate, a first transfer chamber in which the substrate is transferred in a vacuum state, a second transfer chamber in which the substrate is transferred in an atmospheric pressure state, a depressurizable preparatory chamber connecting the first transfer chamber and the second transfer chamber, and a controller that executes a maintenance recipe in the preparatory chamber and a production recipe in the process chamber, respectively, in which, when the controller receives an instruction for executing the production recipe during execution of the maintenance recipe, the controller temporarily stops the maintenance recipe and preferentially executes the production recipe, and continuously executes the temporarily stopped maintenance recipe, after completion of the production recipe.

10 Claims, 5 Drawing Sheets

(56) References Cited

U.S. PATENT DOCUMENTS

| | | | |
|---|---|---|---|
| 2009/0229634 A1* | 9/2009 | Nomura | H01L 21/67276 134/18 |
| 2009/0269171 A1 | 10/2009 | Iijima et al. | |
| 2011/0218659 A1 | 9/2011 | Nomura | |
| 2015/0064908 A1* | 3/2015 | Moriya | C23C 16/4405 438/694 |

FOREIGN PATENT DOCUMENTS

| | | |
|---|---|---|
| JP | 2004-281832 A | 10/2004 |
| JP | 2009-267218 A | 11/2009 |
| JP | 2011-181771 A | 9/2011 |
| JP | 2014-090013 A | 5/2014 |
| JP | 2014-232816 A | 12/2014 |

OTHER PUBLICATIONS

International Search Report dated Dec. 13, 2016 of PCT International Application No. PCT/JP2016/078436.

\* cited by examiner

SUBSTRATE PROCESSING APPARATUS

CROSS-REFERENCE TO RELATED APPLICATION(S)

This application is a Bypass Continuation Application No. PCT/JP2016/078436, filed on Sep. 27, 2016, the entire contents of which are incorporated herein by reference.

TECHNICAL FIELD

This present disclosure relates to a substrate processing apparatus for processing a substrate.

BACKGROUND

In a typical substrate processing apparatus, a recipe for maintenance has been automatically executed when the timing reaches predetermined maintenance timing set by maintenance information, for example, when the timing reaches a predetermined substrate processing time, a predetermined number of processing times, or a predetermined cumulative film thickness value. Meanwhile, when an alarm such as a hard interlock, a temperature deviation error, or a flow rate deviation error occurs, the maintenance recipe is automatically executed at timing when process recipe execution is completed (Patent Literature 1).

In recent years, regulations on particles in a load lock chamber (LC) have also been strict. As for the LC, regular maintenance has been manually performed. In the maintenance, automatic production processing is temporarily stopped and an operator manually performs the maintenance. Therefore, there is a problem of a decrease in the production efficiency.

Furthermore, since the number of pumps connected to a plurality of load lock chambers and vacuum transfer modules is one due to an exhaust configuration of the apparatus, a recipe including exhaust processing cannot be executed in a first load lock chamber in the case where a maintenance automatic recipe with exhaust processing using the pump is executed in a second load lock chamber, for example. That is, the available load lock chamber of the load lock chambers could not be used and a decrease in the operation rate has been concerned.

CITATION LIST

Patent Literature

Patent Literature 1: JP 2011-243677 A

SUMMARY OF INVENTION

In view of the foregoing, a configuration that maintains productivity and can automatically execute and control recipes is presented.

According to an aspect of this present disclosure, provided is a configuration including a process chamber that processes a substrate, a first transfer chamber in which the substrate is transferred in a vacuum state, a second transfer chamber in which the substrate is transferred in an atmospheric pressure state, a depressurizable preparatory chamber connecting the first transfer chamber and the second transfer chamber, and a controller that executes a maintenance recipe in the preparatory chamber and a production recipe in the process chamber, respectively, in which, when the controller receives an instruction for executing the production recipe during execution of the maintenance recipe, the controller temporarily stops the maintenance recipe and preferentially executes the production recipe, and continuously executes the temporarily stopped maintenance recipe, after completion of the production recipe.

According to this present disclosure, the operation efficiency of a semiconductor manufacturing apparatus can be improved.

DETAILED DESCRIPTION OF THE PREFERRED EMBODIMENTS

Figure 1:
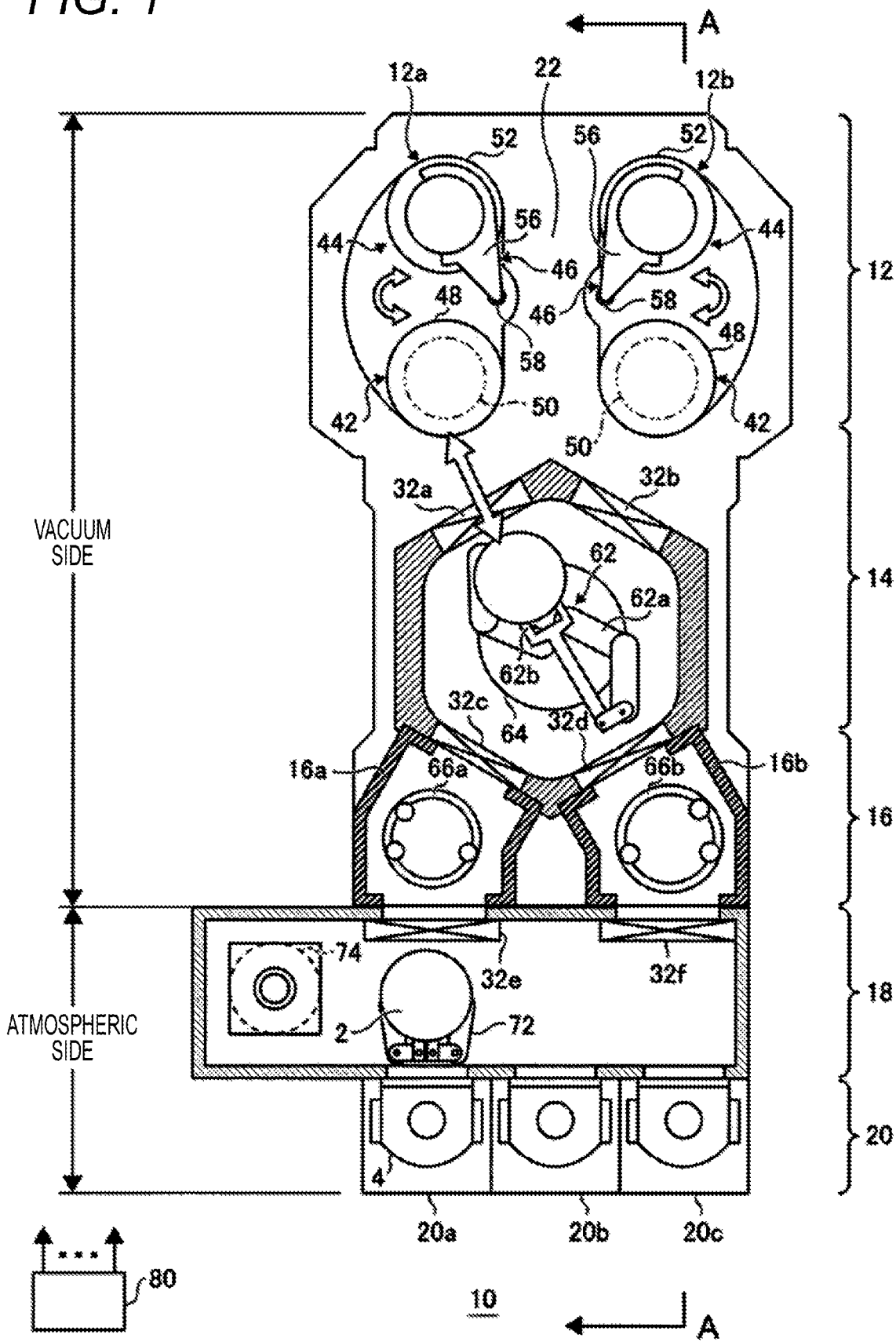
FIG. 1 is a schematic view of a substrate processing apparatus suitably used as an embodiment of this present disclosure, as viewed from above.
Figure 2:
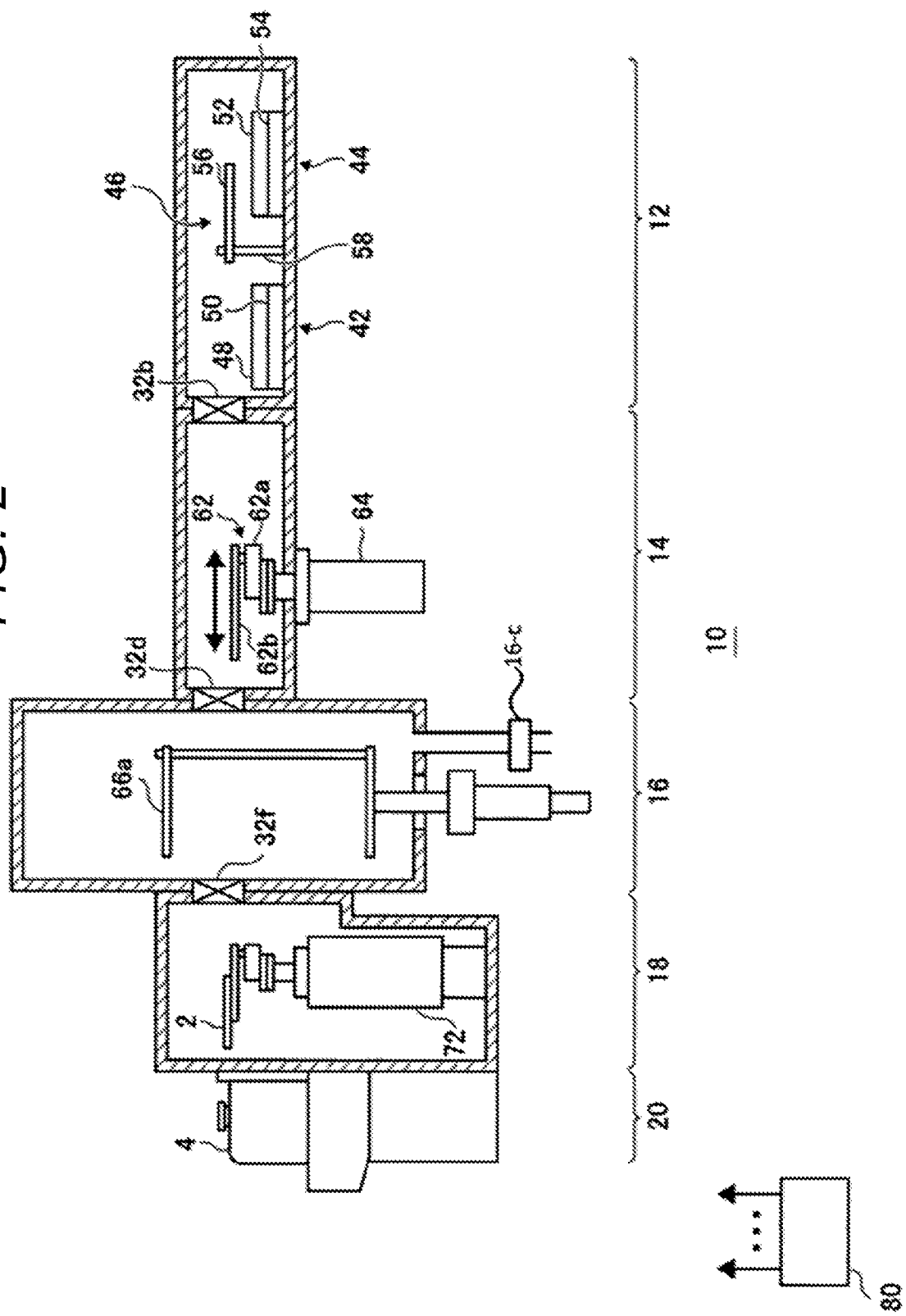
FIG. 2 is a schematic view of a plane passing through line A-A in FIG. 1.

A substrate processing apparatus 10 according to an embodiment of this present disclosure will be described with reference to FIGS. 1 to 3.

The substrate processing apparatus 10 according to the present embodiment is a cluster-type apparatus and is divided into a vacuum side and an atmospheric side. The substrate processing apparatus 10 is configured by a plurality of modules. The substrate processing apparatus 10 includes, as modules, a process chamber (PC) 12 as a process chamber for processing a substrate, a vacuum transfer module (TM) 14 as a first transfer chamber, a load lock chamber (LC) 16 as a preparatory chamber, an atmospheric transfer module (ATM) 18 as a second transfer chamber, and a load port (LP) 20.

(Vacuum Side) The substrate processing apparatus 10 is provided with, on a vacuum side, two PCs 12 (a process chamber 12a and a process chamber 12b) for processing a wafer 2 as a substrate, a vacuum-tight TM 14, and two LCs 16 (a load lock chamber 16a and a load lock chamber 16b). Here, the process chamber 12a and the process chamber 12b may be collectively referred to as "PC (process chamber) 12" and the load lock chamber 16a and the load lock chamber 16b may be collectively referred to as "LC (load lock chamber) 16" in some cases. The TM 14 is connected to each of the PCs 12, and each of the LCs 16 is connected to the TM 14. The space between the PCs 12 is shielded by a wall portion 22.

The PC 12 processes the wafer 2. The PC 12 performs, for example, a step of forming a thin film on the wafer 2, a step of forming an oxide film or a nitride film on a surface of the wafer 2, a step of forming a metal thin film or a metal compound thin film on the wafer 2, and the like.

Figure 3:
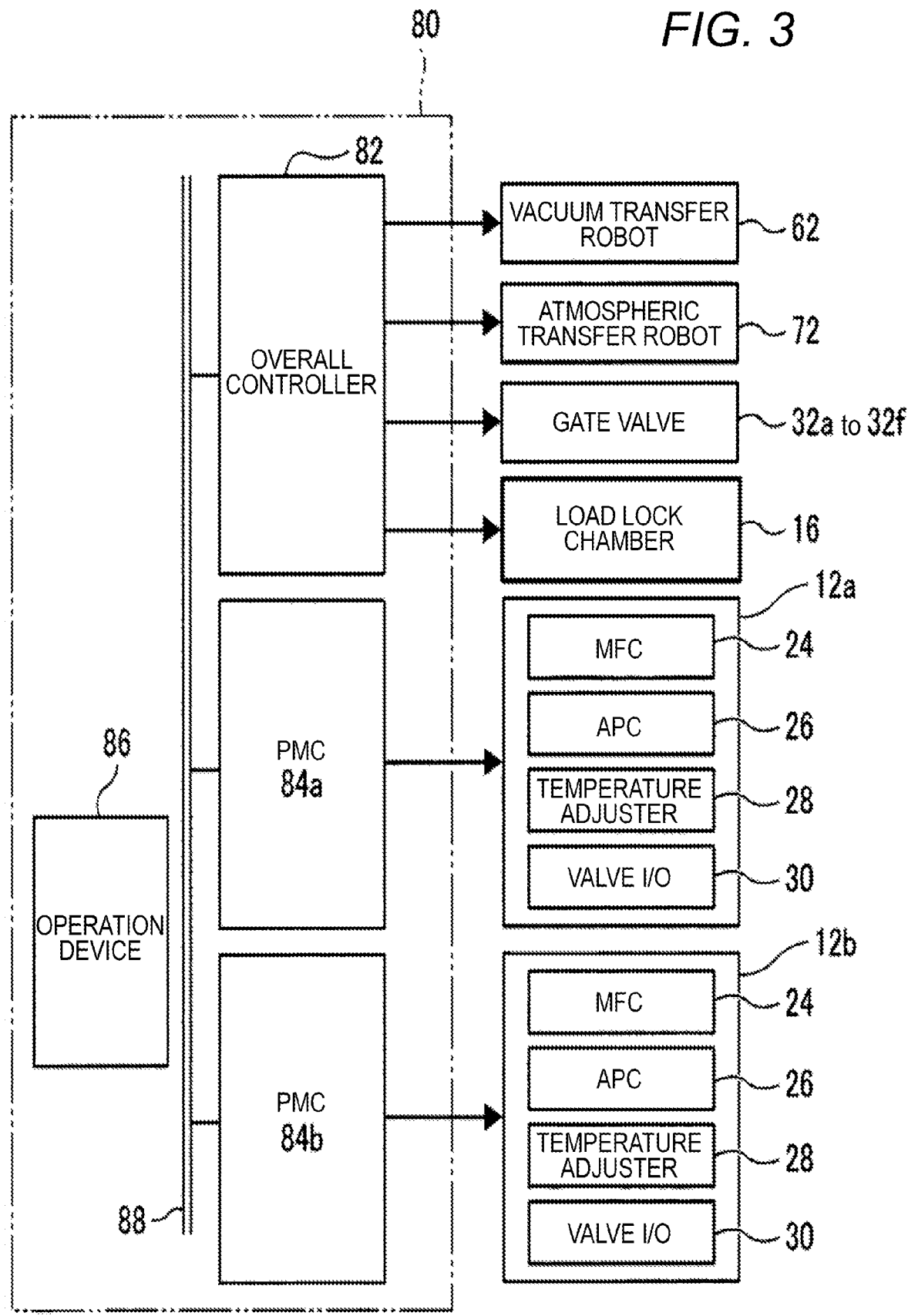
FIG. 3 is a functional block diagram of a controller suitably used as an embodiment of this present disclosure.
Figure 4:
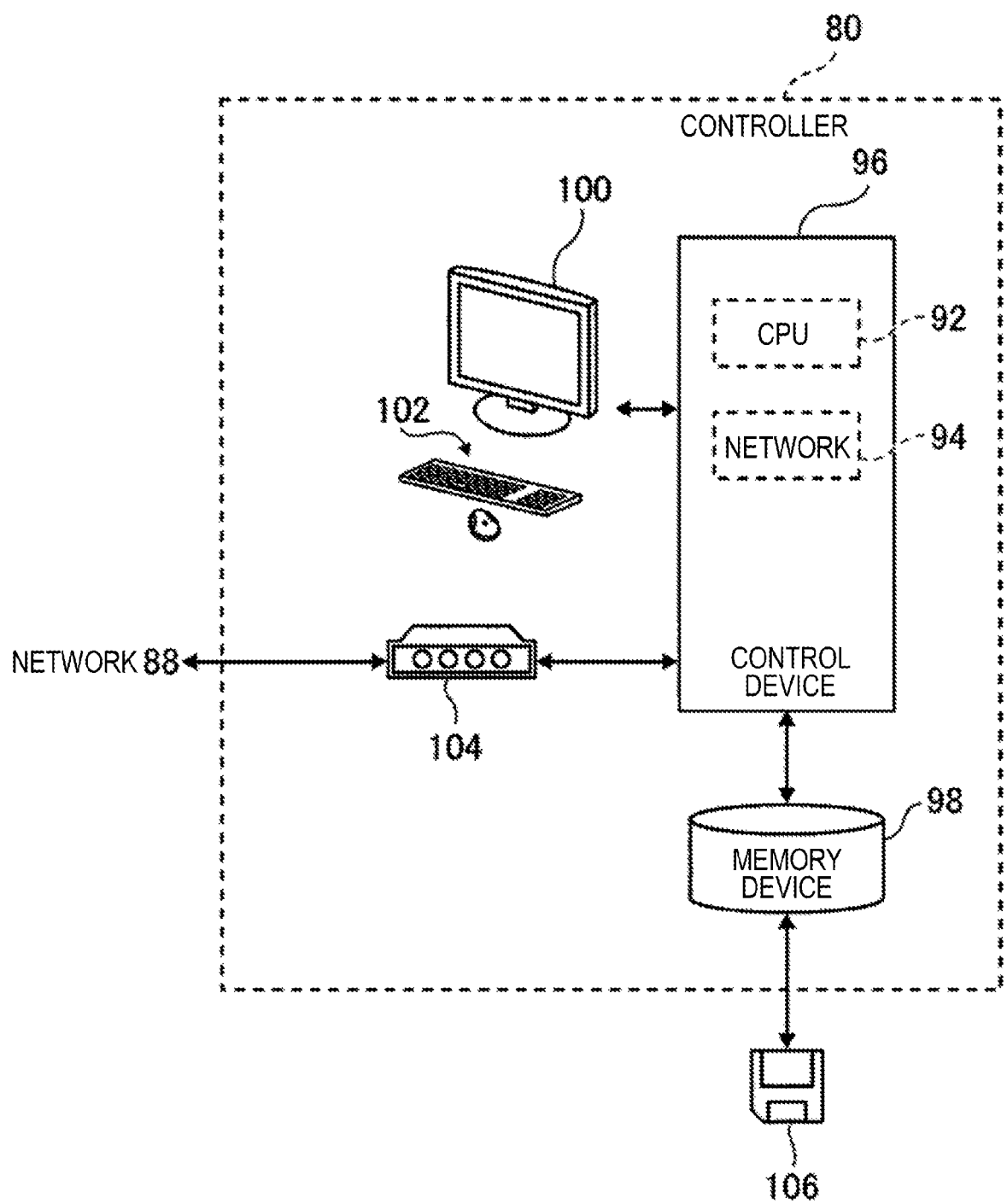
FIG. 4 is a hardware configuration of the controller suitably used as an embodiment of this present disclosure.

As illustrated in FIG. 3, each PC 12 is provided with a mass flow controller (MFC) 24 that controls a flow rate of a processing gas supplied into the PC 12, an auto pressure controller (APC) 26 that controls the pressure in the PC 12, a temperature adjuster 28 that adjusts the temperature in the PC 12, and a valve I/O 30 that controls ON/OFF of a supply/exhaust valve of the processing gas.

The PC 12a communicates with the TM 14 via a gate valve (GV) 32a, and the PC 12b communicates with the TM 14 via a GV 32b. The PC 12 and the TM 14 communicate with each other via the GV 32a and the GV 32b as a first opening/closing section.

For example, in the case where the wafer 2 is processed in the PC 12a, the substrate processing apparatus 10 operates as follows. First, the inside of the PC 12a is set to an atmosphere similar to the inside of the TM 14. The GV 32a is opened, and the wafer 2 is transferred into the PC 12a. The GV 32a is closed, and predetermined processing is applied to the wafer 2. Next, after the atmosphere in the PC 12a is returned to the atmosphere similar to the inside of the TM 14, the GV 32a is opened and the wafer 2 is unloaded out of the PC 12a. Then, the GV 32a is closed. Similarly, the opening/closing operation of the GV 32b is performed in the PC 12b, whereby the wafer 2 is processed while the atmosphere in the chamber is appropriately maintained.

Each of the PCs 12a and 12b is provided with a first processing portion 42, a second processing portion 44 disposed at a position farther from the TM 14 than the first processing portion 42, and a wafer transfer device 46 that transfers the wafer 2 between the second processing portion 44 and the TM 14.

The first processing portion 42 includes a first placing base 48 on which the wafer 2 is placed and a first heater 50 that heats the wafer 2 placed on the first placing base 48. The second processing portion 44 includes a second placing base 52 on which the wafer 2 is placed and a second heater 54 that heats the wafer 2 placed on the second placing base 52. Note that the first placing base 48 and the second placing base 52 are formed of, for example, aluminum.

The wafer transfer device 46 includes a substrate support member 56 that supports the wafer 2, and a moving shaft 58 that rotates and lifts the substrate support member 56. The moving shaft 58 is provided near the wall portion 22. The wafer transfer device 46 rotates the substrate support member 56 toward the first processing portion 42 side, thereby to give and receive the wafer 2 to/from a vacuum transfer robot 62 of the TM 14 on the first processing portion 42 side.

Since the moving shaft 58 is disposed on the wall portion 22 side, space saving can be achieved as compared with a case not having the present configuration. Specifically, the space required on the outside of each of the PCs 12a and 12b is omitted, and an external space (for example, a maintenance space into which a maintenance person enters) is largely secured.

The PC 12a and the PC 12b are symmetrically configured with respect to the wall portion 22. The wafer transfer devices 46 of the PC 12a and the PC 12b are disposed close to each other across the wall portion 22.

The TM 14 has a load lock chamber structure that withstands pressure (negative pressure) less than atmospheric pressure such as a vacuum state. In the present embodiment, a casing of the TM 14 is formed in a box shape having a hexagonal shape in plan view, and having upper and lower both ends closed. The casing of the TM 14 is not limited to this form, and another form may be employed.

The vacuum transfer robot 62 as a first transfer section is provided in the TM 14 as a first transfer chamber. The vacuum transfer robot 62 places the wafer 2 on a substrate placing portion 62b provided on an arm 62a and reciprocally transfers the wafer 2 between the PC 12 and the LC 16. The vacuum transfer robot 62 moves up and down while maintaining airtightness of the TM 14 by an elevator 64. In the vacuum transfer robot 62, the arm 62a and the substrate placing portion 62b function as the first transfer section that transfers the wafer 2.

The TM 14 communicates with the LC 16a via a GV 32c and communicates with the vacuum lock chamber 16b via a GV 32d. The TM 14 and the LC 16 communicate with each other through the GV 32c and the GV 32d as a second opening/closing section.

The LC 16 functions as a preparatory chamber for transferring the wafer 2 between the TM 14 and the atmospheric side while maintaining the vacuum state of the TM 14. The LC 16 has a structure that can withstand negative pressure. The interiors of the LC 16a and LC 16b are configured to be vacuum-exhausted by a vacuum pump 16c.

The interiors of the LC 16a and LC 16b are respectively provided with a boat 66a and a boat 66b (hereinafter may be collectively referred to as "boat 66" in some cases) as substrate supports that support the wafers 2. The boat 66 holds, for example, twenty five wafers 2 in a stacked manner at regular intervals. The boat 66 is formed of silicon carbide or aluminum, for example. The LC 16 is provided with a cooling mechanism (not illustrated) for cooling the wafer 2. The cooling mechanism may be separately provided from the LC 16. Further, the LC 16a and the LC 16b are provided with the vacuum pump 16c that is commonly used.

The LC 16a communicates with the ATM 18 on the atmospheric side via a GV 32e. The LC 16b communicates with the ATM 18 on the atmospheric side via a GV 32f.

The TM 14 in the vacuum state and the ATM 18 in the atmospheric pressure state, do not directly communicate with each other. Specifically, at least one of the GV 32c and the GV 32e is in a closed state, and similarly, at least one of the GV 32d and the GV 32f is in a closed state. For example, when opening the GV 32c on the TM 14 side, the GV 32e on the ATM 18 side is closed and the LC 16a is brought into in the vacuum state by the pump 16c. Note that "vacuum" means industrial vacuum. When opening the GV 32e on the ATM 18 side, the GV 32c on the TM 14 side is closed and the LC 16a is brought into the atmospheric pressure state.

By opening the GVs 32e and 32f while keeping the GVs 32c and 32d in the closed state, the wafers 2 are transferred between the LCs 16a and 16b and the ATM 18 while maintaining the vacuum state of the TM 14. By opening the GVs 32c and 32d after vacuum-exhausting the LCs 16a and 16b while keeping the GVs 32c to 32f in the closed state, the wafers 2 are transferred between the LCs 16a and 16b and TM 14 while maintaining the vacuum state of the TM 14.

The TM 14 and the LC 16 communicate with the PC 12 via the GVs 32a to 32d as the opening/closing sections. TM 14 and LC 16 function as pass-through chambers through which the wafer 2 transferred between the PC 12 and the ATM 18 in the atmospheric pressure state passes while maintaining the vacuum state of the PC 12.

(Atmospheric Side) The substrate processing apparatus 10 is provided with, on the atmospheric side, the ATM 18 as a second transfer chamber connected to the LC 16, and three LP 20a, LP 20b, and LP 20c (may be collectively referred to as "LP (load port) 20" in some cases) as a substrate accommodating portion connected to the ATM 18. A pod 4 as a substrate accommodating container that accommodates a plurality of wafers 2 is placed on each of the LPs 20a to 20c. The pod 4 is provided with a plurality of slots as a substrate storage that stores a plurality of wafers 2.

An atmospheric transfer robot 72 as a second transfer section is provided in the ATM 18. The atmospheric transfer robot 72 has an arm, and a substrate placing portion on which a plurality of wafers 2 is placed is formed on the arm. The atmospheric transfer robot 72 reciprocally transfers the wafer 2 between the pod 4 placed on the LP 20 and the LC 16.

A positioning device 74 as a substrate position correction device that positions orientation flats of the wafers 2 is provided in the ATM 18. The positioning device 74 may position notches of the wafers 2, in place of the orientation flats, in accordance with the type of the wafer 2 to be processed.

(Control section) The substrate processing apparatus 10 includes a controller 80 as a control section, and the configurations of the substrate processing apparatus 10 are controlled by the controller 80. The controller 80 includes an overall controller 82 that controls the substrate processing apparatus 10 in an overall manner, process module controllers (PMCs) 84a and 84b (hereinafter may be collectively referred to as "PMC 84" in some cases) that respectively control the PCs 12a and 12b, and an operation device 86 that gives and receives information to/from an operator. The overall controller 82, the PMC 84, and the operation device 86 are connected via a network 88 such as a LAN line.

The PMC 84 controls the MFC 24, the APC 26, the temperature adjuster 28, and the input/output valve I/O 30 provided in the corresponding PC 12. The PMC 84 performs exhaust of the corresponding PC 12, supply of the processing gas to the PC 12, control of pressure and temperature, and the like, so that the wafer 2 is processed.

The overall controller 82 is connected to the PMC 84, the vacuum transfer robot 62, the atmospheric transfer robot 72, the GVs 32a to GV 32f, the LC 16, and the like via the network 88.

The overall controller 82 controls transport operations of the vacuum transfer robot 62 and the atmospheric transfer robot 72, opening/closing operations of the GVs 32a to 32f, an exhaust operation of the interior of the LC 16, and the like. Specifically, the overall controller 82 controls the configurations on the basis of wafer storage information regarding in which slot of which pod 4 the wafer 2 is to be placed, wafer position information regarding the current position of the wafer 2, a state of process processing of the wafer 2, a wafer ID for uniquely identifying each of the plurality of wafers 2, a recipe regarding processing conditions of the wafer 2.

Next, a hardware configuration of the controller 80 will be described.

The controller 80 includes a control device 96 including a central processing unit (CPU) 92 as a processor, a memory 94 and the like, a memory device 98 such as a hard disk drive (HDD), a display device 100 such as a liquid crystal display, an input device 102 such as a keyboard and a mouse, and a communication device 104 that perform communication via the network 88. As the controller 80, a general-purpose computer is used, for example. Further, the controller 80 includes the display device 100, the input device 102, and the like, and creates a recipe, inputs a setting, or inputs a prepared recipe. Note that the display device 100 may be a touch panel, and the input device may be omitted.

In the controller 80, a predetermined program is stored in the memory device 98 via the communication device 104 or a memory medium 106, loaded in the memory 94, and executed on an operating system (OS) that operates on the control device 96.

The memory 94 is a recording medium configured by an EEPROM, a flash memory, a hard disk, or the like, and which stores an operation program of the CPU and the like. The memory 94 functions as a work area of the CPU, or the like.

The CPU 92 constitutes the center of the operation section, and executes a control program stored in the memory 94 and executes a recipe (for example, a process recipe) stored in a recipe memory according to an instruction from an operation panel.

The control device 96 can be configured by installing the above-described program stored in the external memory medium (for example, a semiconductor memory such as a USB memory or a memory card) 106 into a computer. The memory device 98 and the memory medium 106 are configured as computer-readable recording media. Hereinafter, the computer-readable recording media are collectively and simply referred to as recording medium. In the present specification, the term "recording medium" may include only the memory device 98 alone, only the external memory medium 106 alone, or both.

Means for supplying these programs are arbitrary. Besides being able to be supplied via a predetermined recording medium as described above, the programs may be supplied via a communication line, a communication network, a communication system, or the like, for example. In this case, for example, the programs may be posted on a bulletin board of the communication network, and the programs may be provided by being superimposed on carrier waves via the network. Then, the programs provided in this manner are activated and executed similarly to other application programs under control of the OS, whereby the above-described processing can be executed.

In the present embodiment, the memory device 98 of the controller 80 stores an overall control program for controlling the entire system of the substrate processing apparatus 10, a process chamber operation program for operating the PC 12, a pass-through chamber adjustment program for adjusting the atmosphere in the vacuum transfer module 14 and the LC 16 as the pass-through chambers, and the like.

Further, the controller 80 includes a program storage and a data storage. The program storage stores a process program for executing a process, a recipe program for executing a recipe (also referred to as a production recipe in the present embodiment) corresponding to the process, and a substrate processing program necessary for substrate processing, and further stores a recipe for maintenance (also referred to as a maintenance recipe in the present embodiment) for adjusting the atmosphere of the chamber to be described below, and a production recipe interruption program. Further, the data storage records data of the temperature, pressure, gas flow rate and the like of the PC 12 of during the recipe processing.

When the overall control program is executed by the control device 96, a function to transmit an operation command (message) to the overall controller 82 and receive an operation report (message) from the overall controller 82 is realized. When the process chamber operation program is executed by the control device 96, a function to transmit an operation command (message) to the PMC 84 and receive an operation report (message) from the PMC 84 is realized. When the pass-through chamber adjustment program is executed by the control device 96, a function of a pass-through chamber adjustment operation for executing a pass-through adjustment step (S200) to be described below is realized.

Figure 5:
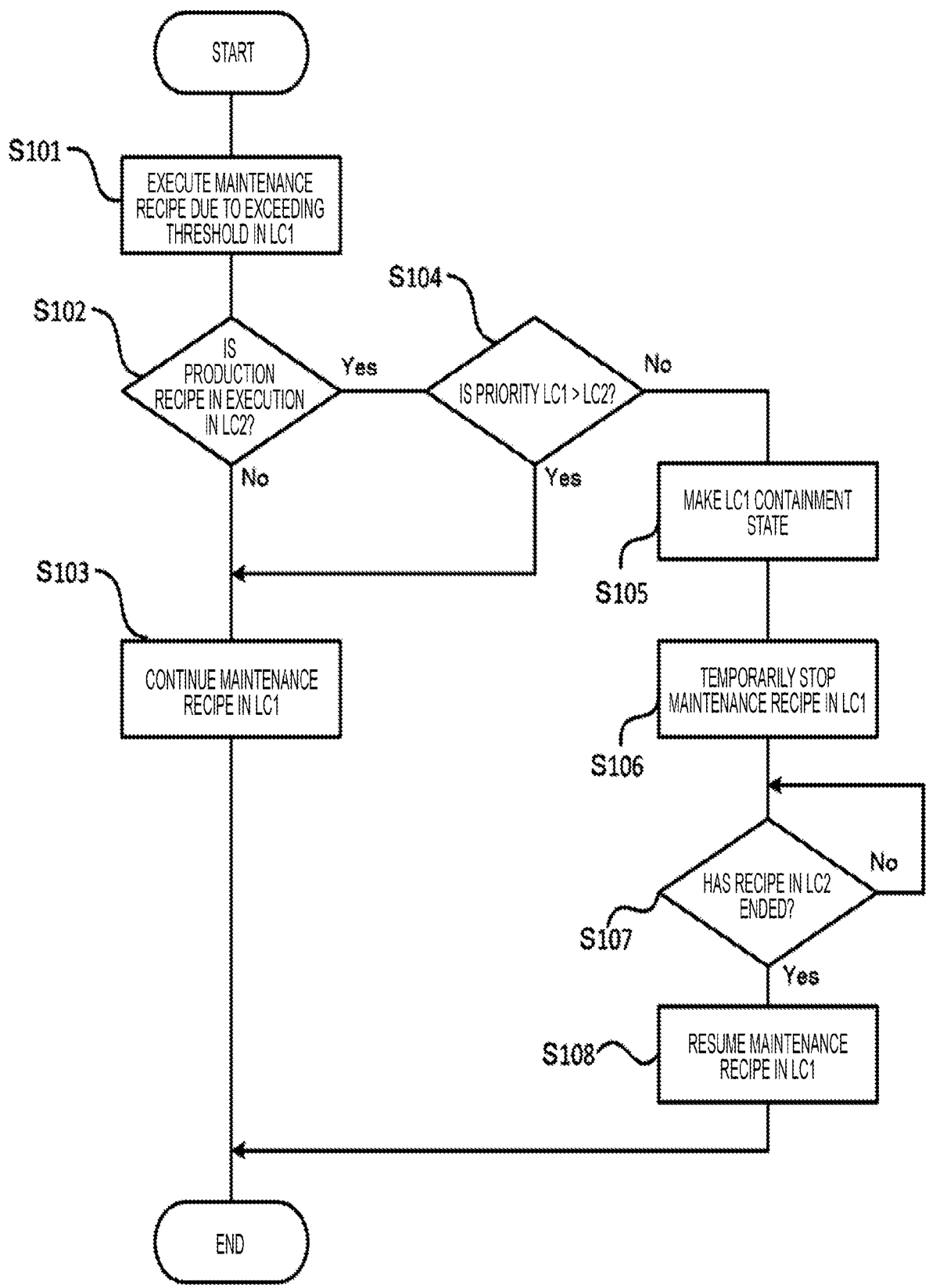
FIG. 5 is a diagram illustrating an example of a processing flow in this present disclosure.

Next, an example of substrate processing of this present disclosure will be described with reference to FIG. 5. FIG. 5 illustrates a flow of the production recipe interruption program executed by the control device 96.

For example, in the case where a production recipe for processing a production lot is executed while a maintenance recipe is being executed in the LC 16a (LC 1), production is started using the LC 16b (LC 2). FIG. 5 illustrates an overview of the processing flow. Here, the maintenance recipe is configured to cycle purge the LC 16 as the preparatory chamber. Further, the maintenance recipe is configured to perform a leak check the LC 16 as the preparatory chamber. Here, the cycle purge is to repeat purging of the preparatory chamber (LC 16) to adjust the atmosphere in the chamber. Specifically, depressurization of the preparatory chamber up to a predetermined pressure and supply of an inert gas (for example, an N2 gas) to the preparatory chamber (atmospheric pressurization) are repeated. Note that a small amount of inert gas may be supplied when the vacuum pump 16c depressurizes the preparatory chamber.

The control device 96 executes the maintenance recipe because the number of processed substrates exceeds a predetermined threshold in LC 1 (S101). This maintenance recipe is composed of twenty steps in total, for example.

Meanwhile, the control device 96 transfers the wafer 2 as a designated substrate from the LP 20 to the LC 2 via the atmospheric transfer robot 72. When the transfer is completed, the atmospheric atmosphere is changed to the vacuum atmosphere in the LC 2, and the production recipe for processing the wafer 2 is executed. The control device 96 confirms execution of the production recipe on the LC 2 side after 3 seconds of the 10th step of the maintenance recipe on the LC 1 side, for example (S102). The control device 96 continues the maintenance recipe on the LC 1 side while not confirming the execution of the production recipe (S103).

When confirming the execution of the production recipe on the LC 2 side, the control device 96 checks the priority of recipe execution between the LC 1 and the LC 2 (S104). In the case where the priority of the LC 1 is higher, the maintenance recipe being executed in the LC 1 is continued (S103). Here, simply, the control device 96 may check preset priorities of the LC 1 and the LC 2, and determine that the priority of the maintenance recipe on the LC 1 is lower than the priority of the production recipe on the LC 2 in the case where the priority of the LC 1 is lower. Alternatively, the control device 96 may perform determination according to the types of the recipes to be respectively executed in the LC1 and LC2. For example, the control device 96 may determine that the priority of a process recipe is higher than the priority of the maintenance recipe (S104).

In S104, the control device 96 may incorporate a maintenance recipe execution state on the LC 1 side into the determination of the priority. For example, the control device 96 may determine that the priority of the LC 1 is higher when the maintenance recipe has been executed up to a predetermined step. Further, the control device 96 may determine that the priority of the LC1 is higher when the maintenance recipe has been executed a predetermined number of times in the case where the maintenance recipe is cycle purge. Favorably, the control device 96 compares a time obtained by adding a time to complete the maintenance recipe on the LC 1 and a time to execute the process recipe using both the LC 1 and the LC 2 with a time to temporarily stop the maintenance recipe on the LC 1 and execute the process recipe on the LC2, and determines the priority to select the case in which the process recipe can be completed earlier (shorter time). That is, by doing so, the maintenance recipe can be executed while suppressing the decrease in the production efficiency.

When the control device 96 determines that the priority of the maintenance recipe on the LC 1 side is low in step S104, the control device 96 closes all the valves of the LC 1 to make the LC 1 be in an containment state (S105). The control device 96 may transition to the containment operation of the LC 1 after completing the 10th step (completing the running step) of the maintenance recipe on the LC 1, depending on the content of the step. Alternatively, the control device 96 may forcibly terminate the running step and transition to the containment operation of the LC 1. In the case where the MFC is connected, the flow rate is set to 0 SLM.

In this state, the control device 96 temporarily stops the maintenance recipe of the LC 1 (S 106).

The control device 96 continues execution of the production recipe on the LC 2. Meanwhile, the control device 96 monitors the progress of the production recipe on the LC 2 (whether the recipe has been completed) at a constant frequency (S107).

The control device 96 also monitors signals of interlocks and the like at the same time, cancels the temporary stop state as needed, transitions to a reset state, and forcibly terminates the recipe in some cases. When the production recipe on the LC 2 is terminated, the control device 96 confirms completion of the recipe on the LC 2, and resumes the recipe on the LC 1 from the beginning of step S10 (S108). (For example, in the case where step S10 is a step of 30 seconds, the control device 96 temporarily stops step S10 after 3 seconds, and starts step S10 again from 0 seconds and performs step S10 for 30 seconds.)

In S108, the control device 96 may measure the time to complete the production recipe on the LC 2 side, and execute the temporarily stopped maintenance recipe from the beginning in the case where a predetermined time or more passes. Alternatively, the control device 96 may execute the maintenance recipe from the beginning according to the number of times that has been performed until the temporary stop of the maintenance recipe. For example, in the case where the maintenance recipe is cycle purge, the number of times that has been performed until the temporary stop of the maintenance recipe may be cleared, and the cycle purge may be repeated from the first time. Alternatively, the control device 96 may execute the maintenance recipe from the beginning unless the maintenance recipe has been executed up to a predetermined step.

According to the present embodiment, the wafer 2 can be processed using the LC 2 while suppressing particles in the LC 1, for example. Therefore, the decrease in the apparatus operation rate can be suppressed. Further, the production recipe for processing the wafer 2 can be preferentially executed in the middle of the maintenance recipe. Therefore, the decrease in the apparatus productivity can be suppressed.

According to the present embodiment, the production recipe for processing the wafer 2 can be preferentially executed using the LC 2 in consideration of the progress of the maintenance recipe on the LC 1. As a result, the decrease in the apparatus operation rate can be suppressed because the wafer 2 can be processed, and the particles can also be suppressed because the maintenance recipe can be executed.

According to the present embodiment, the case of executing the production recipe for processing the wafer 2 using the LC 1 and LC 2 after the completion of the maintenance recipe of the LC 1, and the case of temporarily stopping the maintenance recipe of the LC 1 and executing the production recipe for processing the wafer 2 using the LC 2 are compared, and the priority of the maintenance recipe on the LC 1 side and the priority of the production recipe on the LC 2 side are determined. Therefore, the decrease in the apparatus operation rate can be suppressed and the maintenance recipe can be executed without decreasing the production efficiency.

Note that this present disclosure is applicable not only to the substrate processing apparatus of a semiconductor device but also to an apparatus that processes a glass substrate such as an LCD apparatus. The film forming process includes, for example, CVD, PVD, a process of forming an oxide film or a nitride film, and a process of forming a film containing a metal. Further, it goes without saying that this present disclosure can be applied to other substrate processing apparatuses (an exposure apparatus, a lithography apparatus, a coating apparatus, and the like).

This application claims the benefit of priority based on Japanese Patent Application No. 2016-077997 filed on Apr. 8, 2016, the disclosure of which is incorporated herein by reference in its entirety.

INDUSTRIAL APPLICABILITY

This present disclosure is applicable to a processing apparatus configured to periodically execute a maintenance recipe for chambers other than the process chamber.

REFERENCE SIGNS LIST

2 Wafer
10 Substrate processing apparatus
12 Process chamber (PC)
16 Load lock chamber (LC)
80 Controller

The invention claimed is:

1. A substrate processing apparatus comprising:
a process chamber that processes a substrate;
a first transfer chamber in which the substrate 1s transferred in a depressurized state;
a second transfer chamber in which the substrate is transferred in an atmospheric pressure state;
a plurality of depressurizable preparatory chambers connecting the first transfer chamber and the second transfer chamber; and
a controller that controls the plurality of depressurizable preparatory chambers to execute a maintenance recipe in the plurality of depressurizable preparatory chambers, and controls the process chamber to execute a production recipe in the process chamber, wherein when the controller receives an instruction for executing the production recipe in the process chamber during execution of the maintenance recipe in one of the plurality of preparatory chambers,
the controller is configured to compare a time obtained by adding a time to complete the maintenance recipe in the one of the plurality of depressurizable preparatory chambers and a time to execute the production recipe using both of the one of the plurality of the depressurizable preparatory chambers in which the maintenance recipe is completed and the other one of the plurality of the depressurizable preparatory chambers in which the maintenance recipe is not executed, and a time to temporarily stop the maintenance recipe in the one of the plurality of the depressurizable preparatory chambers and execute the production recipe using only the other one of the plurality of the depressurizable preparatory chambers in which the maintenance recipe is not executed, and
the controller is configured to determine whether to continue the maintenance recipe in the one of the plurality of the depressurizable preparatory chambers or to temporarily stop the maintenance recipe in the one of the plurality of the depressurizable preparatory chambers and execute the production recipe in the process chamber according to a comparison result.

2. The substrate processing apparatus according to claim 1, wherein the controller is configured to start executing the maintenance recipe in the one of the plurality of the depressurizable preparatory chambers on the basis of the number of the substrates transferred into the one of the plurality of the depressurizable preparatory chambers.

3. The substrate processing apparatus according to claim 1, wherein the maintenance recipe in the one of the plurality of the depressurizable preparatory chambers is configured to cyclically purge one of the plurality of the depressurizable preparatory chambers.

4. The substrate processing apparatus according to claim 1, wherein the maintenance recipe in the one of the plurality of the depressurizable preparatory chambers is configured to control one of the plurality of the depressurizable preparatory chambers to perform a leak check of the one of the plurality of the depressurizable preparatory chambers.

5. The substrate processing apparatus according to claim 1, wherein the controller is configured to temporarily stop the maintenance recipe in the one of the plurality of the depressurizable preparatory chambers in a case where a priority of the maintenance recipe in the one of the plurality of the depressurizable preparatory chambers is lower than a priority of the production recipe in the process chamber.

6. The substrate processing apparatus according to claim 1, wherein the controller is configured to make the plurality of the depressurizable preparatory chambers be in a containment state when temporarily stopping the maintenance recipe in the one of the plurality of the depressurizable preparatory chambers.

7. The substrate processing apparatus according to claim 1, wherein, in a case where the maintenance recipe in the one of the plurality of the depressurizable preparatory chambers is temporarily stopped, the controller is configured to reexecute, even in a middle of a predetermined step of the maintenance recipe, the predetermined step from beginning.

8. The substrate processing apparatus according to claim 1, wherein the controller is configured to continuously execute the maintenance recipe in the one of the plurality of the depressurizable preparatory chambers according to whether a predetermined step of the maintenance recipe in the one of the plurality of the depressurizable preparatory chambers is being executed, when the controller receives the production recipe in the process chamber.

9. The substrate processing apparatus according to claim 1, wherein the controller is configured to determine whether to continuously execute the maintenance recipe in the one of the plurality of the depressurizable preparatory chambers or to execute the production recipe in the process chamber in accordance with the number of times of the cycle purges executed as the maintenance recipe in the one of the plurality of the depressurizable preparatory chambers, when the controller receives the production recipe in the process chamber.

10. The substrate processing apparatus according to claim 1, wherein when the controller temporarily stops the maintenance recipe in the one of the plurality of the depressurizable preparatory chambers and executes the production recipe in the process chamber, the controller resumes execution of the temporarily stopped maintenance recipe in the one of the plurality of the depressurizable preparatory chambers, after completion of the production recipe in the process chamber.

* * * * *